United States Patent [19]
Letron

[11] Patent Number: 4,742,571
[45] Date of Patent: May 3, 1988

[54] COUPLING DEVICE BETWEEN A METAL WAVE GUIDE, A DIELECTRIC WAVE GUIDE AND A SEMICONDUCTOR COMPONENT AND A MIXER USING THIS COUPLING DEVICE

[75] Inventor: Yves Letron, Fontenay Aux Roses, France

[73] Assignee: Thomson-CSF, Paris, France

[21] Appl. No.: 887,430

[22] Filed: Jul. 21, 1986

[30] Foreign Application Priority Data

Jul. 23, 1985 [FR] France ............................ 85 11246

[51] Int. Cl.$^4$ .................... H04B 1/26; H01P 5/107
[52] U.S. Cl. ................................... 455/327; 333/26; 333/247; 455/328
[58] Field of Search ................... 333/21 R, 26, 33, 34, 333/247, 250; 455/327, 328, 330

[56] References Cited

U.S. PATENT DOCUMENTS

| | | | |
|---|---|---|---|
| 3,711,778 | 1/1973 | Day | 333/247 X |
| 3,995,238 | 11/1976 | Knox et al. | 333/21 R |
| 4,232,401 | 11/1980 | Chang et al. | 455/328 |
| 4,458,222 | 7/1984 | Herstein et al. | 333/247 X |
| 4,654,609 | 3/1987 | Dixon, Jr. et al. | 333/250 X |

FOREIGN PATENT DOCUMENTS 158701 12/1980 Japan ...................................... 333/33

OTHER PUBLICATIONS

1979 IEEE MTT-S International Microwave Symposium Digest, Orlando, Apr. 30-May 2, 1979, pp. 208-210, The Institute of Electrical and Electronic Engineers, Inc., New York, U.S.; M. N. Azarmaneche et al.; "Measurements of Dispersion Characteristics & Field . . .".
IEEE Transactions Microwave Theory and Techniques, vol. MTT-24, No. 11, Nov. 1976. pp. 821-827, IEEE Microwave Theory and Techniques Society, New York, U.S.; T. Itoh: "Inverted Strip Dielectric Waveguide for Millimeter-Wave Integrated Circuits".
IEEE Transactions on Microwave Theory & Techniques, vol. MTT-29, No. 3, Mar. 1981, pp. 263-265, IEEE, New York, U.S.; S. Bhooshan et al.: "On the Design of Transitions Between a Metal and Inverted Strip Dielectric Waveguide for Millimeter".
IEEE Transactions on Microwave Theory and Techniques, vol. MTT-33, No. 6, Jun. 1985, pp. 539-543, IEEE, New York, U.S.; J. A. G. Malherbe et al.: "A Transition from Rectangular to Nonradiating Dielectric Waveguie".
1979 IEEE MTT-S International Microwave Symposium, Orlando, 30 Apr.-May 2, 1979, pp. 211-213, The Institute of Electrical and Electronic Engineers, Inc., New York, U.S.; R. Mittra et al., "Multimode Waveguide Components for Millimeter-Wave Integrated . . .".
IEEE Transactions on Microwave Theory and Techniques, vol. MTT-30, No. 8, Aug. 1982, pp. 1241-1247, IEEE Microwave Theory and Techniques Society, New York, U.S.: C. Yao et al.: "Monolithic Integration of a Dielectric Millimeter-Wave Antenna and Mixer . . .".

*Primary Examiner*—Paul Gensler
*Attorney, Agent, or Firm*—Oblon, Fisher, Spivak, McClelland & Maier

[57] ABSTRACT

The invention provides a coupling device between a metal wave guide (three dimensional system) and an electronic signal processing circuit (two dimensional system). The transition is provided by means of a dielectric wave guide introduced longitudinally into the metal wave guide. A chamfer cut in the dielectric guide concentrates the energy of the input signal on a face of the dielectric bar, at the interface with another dielectric material (isolated image guide). At this interface, a microstrip line transmits the energy to a semiconductor component.

9 Claims, 2 Drawing Sheets

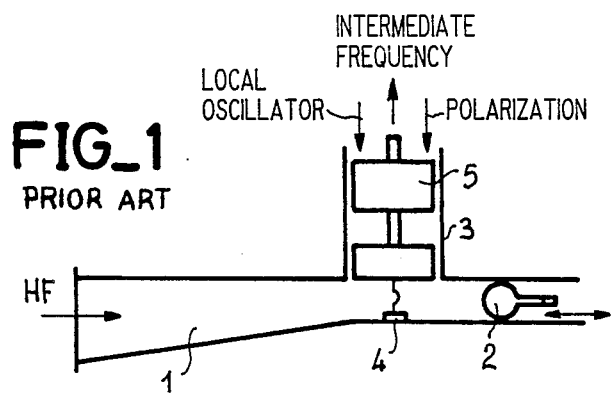
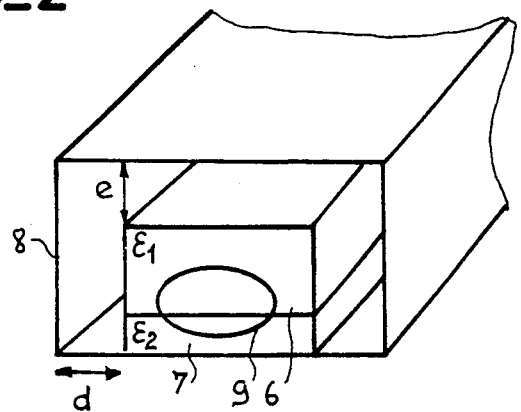
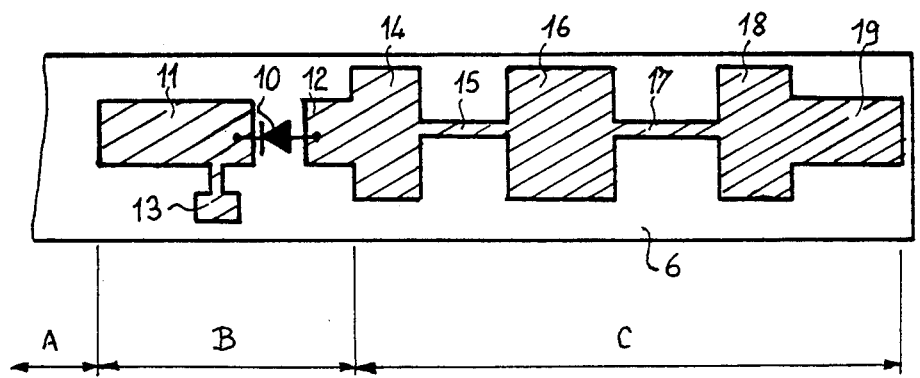

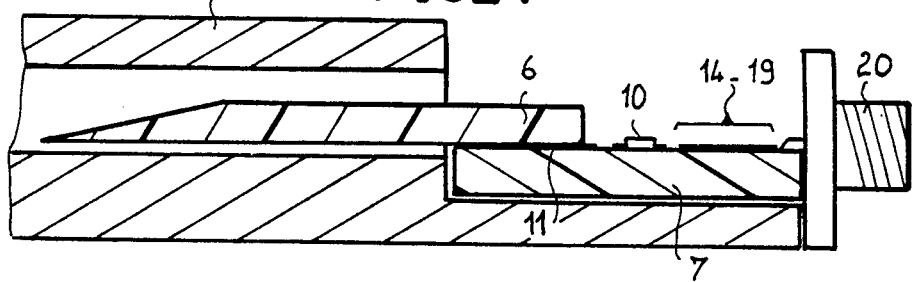
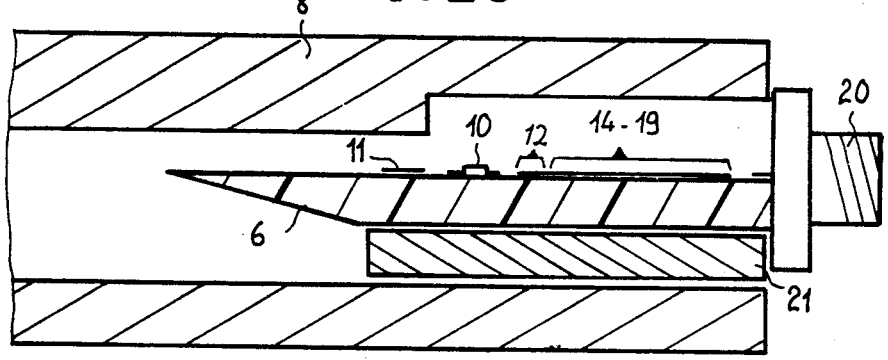
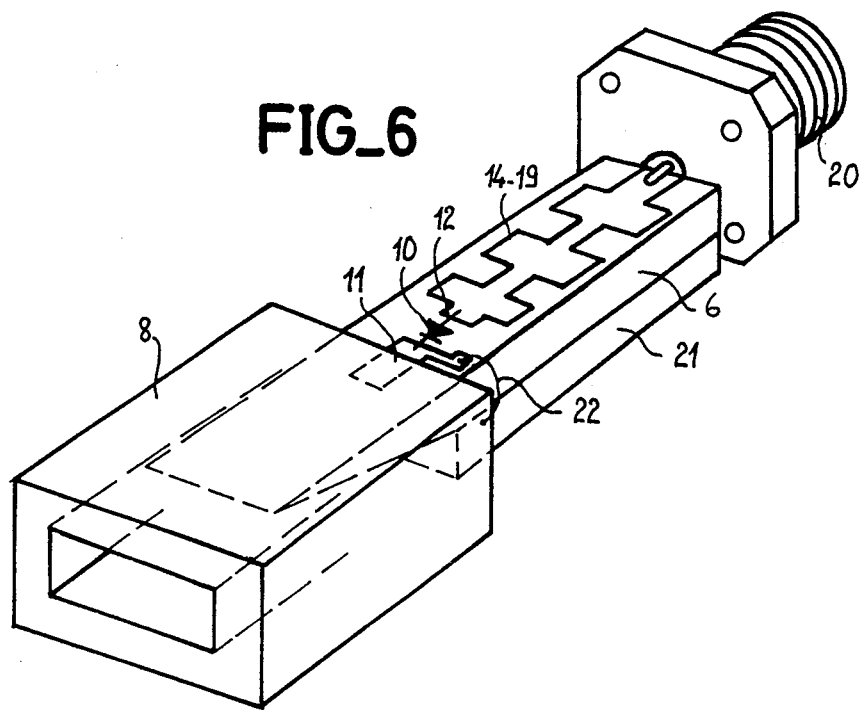

COUPLING DEVICE BETWEEN A METAL WAVE GUIDE, A DIELECTRIC WAVE GUIDE AND A SEMICONDUCTOR COMPONENT AND A MIXER USING THIS COUPLING DEVICE

BACKGROUND OF THE INVENTION

The present invention relates to a coupling device between a metal wave guide, a dielectric wave guide and an active semiconductor component which processes the ultra high frequency signal detected and outputs an electric signal over a microstrip line.

With this coupling device it is possible to pass from an electric signal at a very high frequency such as 94 GHz, conveyed by metal wave guides to a signal of lower frequency of the order of 1 GHz for example, which can be conveyed and processed with electronic semiconductor components such as transistors and integrated circuits. It provides integration of the electronic signal processing functions. The invention also relates to a simple mixer having a dielectric guide structure with isolated image, using Schottky diodes called Beam lead diodes.

It is known that 94 GHz corresponds to a window in which the ultrahigh frequency waves are transmitted particularly well through the earth's atmosphere and this frequency is very widely used for radar transmissions and detection.

Passing over from a device such as a metal wave guide to a device such as an electronic circuit on a substrate, supporting one or more active components—diodes, transistors, integrated circuits—even at the level of elementary ultra high frequency functions raises a certain number of problems. The development of active functions with dielectric guides is more difficult than that of passive functions. This is mainly due to the fact that the dielectric guide is an open structure: any discontinuity introduced by implanting a semiconductor component causes a parasite radiation and consequently the impedance seen by the component is formed of three components, a resistive part due to the radiation, a resistive part due to the useful load and a reactive part. Moreover, the direct integration of a semiconductor component in the dielectric guide is a difficult approach for it may cause the appearance of a higher order propagation mode or of a mode radiating the ultra high frequency wave transmitted by the metal wave guide.

Known constructions do not really provide integration of a component in a dielectric guide, in that the diodes are very often mounted in a chip or require an antenna for outputting the wave guide signal.

SUMMARY OF THE INVENTION

The coupling device of the invention includes:
a transition zone between propagation in a metal wave guide and propagation in the dielectric wave guide,
a coupling or transition zone between the dielectric guide and the diode and processing of the signal by the diode—detection or mixing—,
and, in the case of a mixer,
an intermediate frequency filtering zone for separating the intermediate frequency IF output signal from the biasing signal of the diode and from the input signal or signals which may be propagated beyond the diode,
an IF output zone formed by a coaxial connector mounted at the end of the dielectric wave guide.

One of the characteristics of the coupling device of the invention is that the dielectric wave guide is introduced longitudinally into the metal wave guide and that the different zones mentioned are all supported by the dielectric bar which forms the wave guide, made from alumina or from a III-V material such as GaAs, this latter further allowing the diode to be integrated in the bar of the dielectric wave guide.

More precisely, the invention relates to a coupling device between a metal wave guide, a dielectric wave guide and a semiconductor component for processing an ultrahigh frequency input signal, wherein the dielectric wave guide, of the "isolated image" type is a bar of dielectric material with permittivity $\epsilon_1$, forming with another dielectric material of permittivity $\epsilon_2$ an interface at the level of which is propagated a part of the energy of the signal channelled by the dielectric bar, this latter being introduced longitudinally into the metal wave guide and comprising a metal guide-dielectric guide transition zone formed by a chamfer, of length 10 $\lambda g$ ($\lambda g$=guided wave length), cut in the dielectric bar, the energy of the signal being coupled to the semiconductor component by means of a microstrip line which forms a transition zone between the dielectric guide and the semiconductor component, at the level of the interface between the two dielectric materials.

BRIEF DESCRIPTION OF THE DRAWINGS

The invention will be better understood from the following description of some embodiments with reference to the accompanying Figures which show:

FIG. 1: a schematical section of a coupling device between a metal wave guide and a diode of the prior art, FIG. 2: a diagram showing the transmission of the waves in a dielectric wave guide coupled to a metal wave guide in accordance with the invention, FIG. 3: a top view of the metallizations deposited on the dielectric wave guide showing the transition zone and the filtering zone, according to the invention;

FIG. 4: a sectional view of a first type of coupler according to the invention,

FIG. 5: a sectional view of a second type of coupler in accordance with the invention, FIG. 6: a three quarter view in space of a coupler according to the invention.

DESCRIPTION OF THE PREFERRED EMBODIMENT

So as to describe the invention with greater precision, the example will be taken of the case of an isolated image dielectric guide ultra high frequency mixer, which does not restrict the scope of the invention which applies more generally to a coupling device between a metal wave guide, a dielectric wave guide and a semiconductor active component.

In a simple mixer, an ultrahigh frequency signal transmitted for example by microwave links arrives through the metal wave guide, brought to a frequency such as 94 GHz. In order to be able to process the signal using electronic semiconductor circuits, it is mixed with the signal of a local oscillator at 94±1 GHz, for example injected into the metal wave guide. The two signals propagate in the dielectric guide without being mixed. They are mixed by the diode, then filtered by a low pass LC filter. A 1 GHz signal leaves the filter which can be processed using semiconductors.

Up to now, for detecting and/or mixing a HF signal at 94 GHz, devices have been used such as the one shown schematically in FIG. 1. This mixer is formed by a metal wave guide 1, ending at one end in a mobile short circuit 2 and comprising an opening 3 in one edge. A diode 4 is fixed inside the metal wave guide directly below the opening 3; this diode is biased by a voltage which arrives through the output filter 5 formed by capacities and self inductances. The ultra high frequency signal enters the wave guide 1, as well as a signal from the local oscillator. They are fed to the diode 4. The diode mixes the two signals and delivers at the IF output an intermediate signal. This kind of mixer, which must be tuned by adjusting the position of the short circuit 2, has the drawback of being a device in which it is not easy to fix or position the diode 4.

Tests have been made for using chip diodes and a dielectric guide as transition between the metal wave guide and the diode. In other tests attempts were made to use chip diodes integrated in a dielectric guide. In its construction, the Schottky beam lead diodes are mounted in an air cavity at the end of the dielectric wave-image guide and the surface of the dielectric guide surrounding the cavity is metallized, whereas a metal cap soldered to the cavity avoids any parasite radiation at the level of the Schottky diode mount. In other tests, the local oscillator is applied to two Schottky beam lead diodes in series through a microstrip type line, this microstrip line passing through the metal wave guide as the antenna for biasing said diodes.

In yet other tests, a pointed Schottky diode is mounted in a hole formed in the dielectric guide and it is connected to a metal structure deposited on the surface of the dielectric guide: it is then again a structure having a cavity in the dielectric guide. Finally, a structure has been proposed in which the component is mounted in a slit formed in the ground plane so as to reduce the radiation losses. It is from the foregoing that most of the structures studied up to now are structures which include encapsulated diodes mounted in the cavities, even if the cavity is in the last example mentioned formed in the ground plane. The problems raised by integrating a coupling system between a metal wave guide and an electronic circuit etched on a substrate have shown the importance of the three points mentioned above, among which the first is the transition between the metal guide and the dielectric guide.

The transition at the level of the metal wave guide takes place in accordance with the invention by means of an isolated image dielectric guide. An isolated image guide is a dielectric guide mounted on a wafer whose permittivity is such that the energy remains in the dielectric guide and does not pass into the metal of the metal wave guide, since a part of the energy conveyed inside the dielectric wave guide radiates outside. Thus the transition system, such as shown in FIG. 2, includes:

a bar 6 of a dielectric material with high permittivity $\epsilon_1$, a part at least of which is introduced into the metal wave guide, only the inner wall 8 of which is shown in the Figure. This dielectric bar 6 is introduced longitudinally with respect to the wave guide and not as is done in certain designs perpendicularly or acting as an antenna by means of a microstrip line.

a layer 7 between the dielectric bar 6 and the wall of the wave guide 8. This layer 7 has a permittivity $\epsilon_2$, and it may be either a layer of air, or a foil of a dielectric material such as quartz.

a metal plane on which the assembly formed by the dielectric bar 6 and the lower layer 7 is set. The lateral shielding and the lid which surround the dielectric bar, and which are therefore formed by the side wall and upper wall of the wave guide 8 are spaced sufficiently apart from the assembly so as not to create disturbances. Calculations and experimentation have shown that the spacing e between the upper wall of the wave guide and the dielectric bar must be of the order of 0.5 mm, whereas the distance d between the dielectric bar and the side walls of the metal wave guide 8 is of the order of 1 mm.

A dielectric guide such as bar 6 has a range of use between a minimum frequency below which the energy is no longer propagated and a maximum frequency beyond which parasite modes propagate in the guide.

The choice of the guide depends on several criteria:
according to its operating band,
inside this operating band to be in a zone in which the essential part of the energy is concentrated in the dielectric guide so as to avoid the influence of the walls of the case. For this, it is better to be located rather towards the maximum frequency of use which has just been mentioned.
to be in a minimum loss zone, which requires also being at frequencies close to the maximum frequency of use,
the propagation limit of the upper modes may correspond to perpendicularly excited modes or else to harmonic modes. In practice, the perpendicular modes are not necessarily propagated, but is preferable to fix the operating limit short of the maximum frequency,
finally, for integration requirements, the dielectric bar must be sufficiently wide so as to be able to be metallized on one face and etched.

All these conditions lead to choosing a dielectric bar 6 made from alumina A1203 whose constant $\epsilon_1 = 9.8$, whose thickness is 0.6 mm and width 1.2 mm. For a frequency band of 90 to 100 GHz, the dielectric bar is matched by means of a chamfer of about 10 mm in length, which corresponds to the transfer of the energy transported by the metal wave guide 8 towards the dielectric wave guide 6. A view of the chamfer is shown in FIGS. 4, 5 and 6. It is advantageous for the dielectric bar to be as short as possible. In fact, the metal wave guide is a clean device, which does not give harmonics and only has little energy loss, but on the other hand it is difficult to fit a diode therein. The dielectric wave guide, as far as it is concerned, is more convenient than the metal wave guide and lends itself better to integration on a substrate, but after about a centimeter along a dielectric bar, the wave has partly vanished and it includes harmonics. Consequently, it is preferable to provide rapidly a transfer of the energy transported in the metal wave guide to the diode or semiconductor device which will detect and process this form of energy. This is why the dielectric bar has a chamfer of the order of 10 $\lambda g$ in length, $\lambda g$ being the guided wave length, the rest of the bar forming a support for the metallizations which are deposited thereon, and which will be described in more detail later on.

Layer 7 with permittivity $\epsilon_2$ may be an air layer: the variation of thickness of the air layer allows the guided wave length to be adjusted in the dielectric guide. But this layer may also be a layer of a dielectric material such as quartz. In this case the guided wave length $\lambda g$ increases slightly, but it is especially interesting to know that a large part of the energy channelled by the upper dielectric bar 6, that is to say the alumina, is propagated at the interface of the two dielectrics. In fact, at 9 has been shown the approximative envelope of the energy transported in the dielectric guide, the largest part of which it is true is to be found in the dielectric of part 6, but an appreciable amount of which, which forms what is called the image, is transported to the interface between the two dielectrics, and it is because this image is located in the lower dielectric and isolated with respect to the ground plane 8 that this device is called an isolated image device. Thus it is possible to form a mixer in which the mixer diode is placed at the level of the interface between the two dielectrics 6 and 7. It is then convenient to use the quartz foil as support for the diode and to slide this quartz, correctly metallized on the surface, under the dielectric bar 6. The energy will be transmitted from the interface between the two dielectrics towards the diode by means of a metal microstrip line etched on the surface of the quartz, which therefore forms the coupling structure between the dielectric guide and the diode. The drawing of this metallization is shown in FIG. 3, which will be described in greater detail below. If a quartz foil is used having a thickness of 300 microns, matching is best between 95 and 96 GHz with respect to an air layer. Furthermore, a quartz foil is convenient for supporting a dielectric bar, whereas an air layer requires a system for fixing the bar. The fact that it is possible to collect the energy at the interface between the two dielectrics allows the coupling structure between the metal wave guide and the dielectric wave guide to be matched by adjusting the length of the coupling zone between the dielectric guide and the microstrip on the quartz wafer.

FIG. 3 shows a top view of the dielectric bar forming the coupling system; it shows more particularly the metallizations deposited on the end of this dielectric wave guide.

The different zones which have been mentioned, that is to say the metal guide/dielectric guide transition zone, the coupling zone between dielectric guide and diode and the intermediate frequency filtering zone are shown respectively by the letters A, B and C. The part of the dielectric guide which forms the coupling zone between the metal guide and the dielectric guide and which is chamfered is partially outside the Figure, for reasons of space, but is better shown in FIGS. 4 and 5.

The dielectric bar 6 receives, in its end part which serves as support and no longer for matching, a semiconductor component such as the diode 10 mounted as beam lead between two microstrips 11 and 12. The microstrip 11 forms the matching between the dielectric guide and the diode and the microstrip 12 forms a matching length of the diode to the filter. In the edge of the microstrip 11 is provided a metallization 13 providing biasing for the diode. The diode, or any other component adapted depending on the desired use for this coupler between metal guide and dielectric guide, is a component which is essentially matched to the working frequency or to the use which it is desired to make of it. In particular, it is mounted at the surface between two metallizations by means of beam leads and requires neither an encapsulating chip, for it is protected by the structure of the device, nor recessing for example so as to form a cavity in the dielectric bar. The role of the intermediate frequency filter is to separate the signal and local oscillator frequencies, close to 94 GHz, from the mixed frequency which may be between several hundred megahertz up to several gigahertz. A band pass filter for example at 30 GHz may be used or a low pass filter with distributed constant. So as to reduce the dimensions of the filter, a low pass filter with cut off frequency between 30 and 40 GHz has been chosen. It is formed as a microstrip structure on the substrate, which is either a quartz layer if the coupler includes a dielectric and a quartz layer or alumina or gallium arsenide if the coupler is monolithic. This intermediate frequency filter is formed by a succession of widened metallizations 14, 16 and 18, forming capacities, whose ground plane, placed under the dielectric bar forms the other plate. Between these widened zones are placed narrow microstrips such as 15 and 17, these metallizations then forming self inductances, which means that the filter is of the LC type.

This filter must have a short-circuit at 94 GHz in the plane of the diode, which justifies the presence of the matching strip 12, which forms an adjustable line length placed at the input of the filter between the filter and the diode. The connections made for the filter formed on the quartz layer have been optimized for a length of this microstrip 12 equal to $3 \lambda_{eff}/8$. When the coupling device is made on alumina, with the length of the etched ribbon being the same, the matching length is adjusted by modifying the position of the mass plane.

FIG. 4 shows the sectional view of a first type of coupler according to the invention. In a wave guide 8 is introduced longitudinally the chamfer of a dielectric bar 6 whose unchamfered end rests on a quartz lamina 7, the assembly forming the two materials of permittivity $\epsilon_1$ and $\epsilon_2$, whose operation as isolated image guide was described with reference to FIG. 2. The diode 10 is mounted by its beams on the quartz 7, the matching metallization 11 being slid under the dielectric bar 6. The quartz on which the intermediate frequency filter is etched, that is to say the elements 14 to 19 of FIG. 3, is soldered to the ground plane of the metal guide 8. The ultra high frequency energy is directly coupled between the dielectric guide and the microstrip line. The short circuit at the level of the diode is provided by the intermediate frequency filter. The essential adjusting element is the length of the microstrip 11 covered by the dielectric guide 6 which serves as antenna.

The output intermediate frequency signal is taken from the microstrip 19 by a coaxial connector 20, through which arrives also the voltage polarizing diode 10.

The advantage of this mounting is its great flexibility in construction and adjustment, for access is readily had to the different elements of the circuit, diode, filter, guide etc... The drawback is its very little integrated structure: the mixer is formed of three propagation elements—metal guide, dielectric guide, intermediate frequency filter etched on quartz. Moreover, the assembly of the mixer is not shielded, a part of the energy is radiated but shielding may be provided at the same time as a protection cap surrounding the device at the end of the wave guide.

FIG. 5 shows the sectional view of a second type of coupler according to the invention. In this case the mixer is formed as a semi integrated structure, the matching metallizations 11 and 12 and the filter 14 and 19 being directly etched on the dielectric wave guide 6. The beam lead diode is soldered to the filter. In this case the dielectric bar 6 is supported by a metal base 21 which serves as mass plane. As in the case of the preceding Figure, the intermediate frequency signal leaves through a coaxial connector 20.

In so far as the dielectric bar 6 is concerned, the transition between the metal guide and the dielectric guide is provided by a chamfer of 10 λg in length, machined directly in the dielectric bar. This may be, in a semi integrated structure, made from alumina or any other dielectric material suitable at these frequencies. It may also be made from a type III-V material, such as gallium arsenide for example since it is known on the one hand how to form gallium arsenide bars with dimensions sufficient for etching a metallization and, on the other hand, it is known how to form a semi-isolated gallium arsenide which therefore forms a dielectric. In this case the diode may be implanted directly in the bar and thus form a completely integrated structure.

FIG. 6 shows a three quarter view in space of a coupling device of the invention adapted to the case of the mixer. To facilitate reading of this Figure, the metal wave guide 8 is assumed to be transparent. The mixer includes then the following elements which have been previously described:

a common input for the signal to be detected and the local oscillator signal through the metal wave guide 8, a transition between the metal guide and the dielectric guide by means of a chamfer machined in the dielectric, of a length 10 λg, λg being the guided wave length, a dielectric guide-microstrip line transition, the line being etched on the same support as the guide: this is the microstrip line 11. A ground plane is placed directly under the dielectric, in the non chamfered part, the mixing diode, which is preferably of the beam lead type, soldered to the microstrip between its parts 11 and 12.

It is biased by a DC voltage which arrives through the coaxial connector 20 and is relooped to the ground through a metal wire 22;

an intermediate frequency filter, etched as a microstrip structure, lets the intermediate frequency pass and provides in the plane of the diode a short circuit at the frequencies of the input and local oscillator signals, an intermediate frequency signal output through a coaxial connector.

The coupling device and the mixer of the invention are essentially intended for detecting ultra high frequency waves, in short wave links and radars.

What is claimed is:

1. A coupling device between a metal wave guide and a semiconductor component for processing an ultra high frequency input signal inputted via said waveguide, comprising a dielectric wave guide of "isolated image" type, comprising a bar of a first dielectric material having a permittivity $\epsilon_1$ forming , with a surface of a second dielectric material of permittivity $\epsilon_2$, an interface at the level of which is propagated a part of the energy of the signal channelled by the dielectric bar, said dielectric bar including opposed ends, one of which is non-chamfered and overlies said second dielectric material and the other of which is introduced longitudinally into the metal wave guide and zone formed by a chamfer, of length 10 λg, wherein λg=guided wave length, cut in the dielectric bar, the energy of the signal being coupled to the semiconductor component by means of a microstrip line which forms a transition zone between the dielectric guide and the semiconductor component, at the level of the interface between the two dielectric materials.

2. The coupling device as claimed in claim 1, wherein the second dielectric material is a quartz wafer whose face supporting the microstrip line is brought into contact with the dielectric bar, by its non chamfered end, the microstrip line being partially covered by the dielectric bar for collecting the energy at the interface between the two dielectrics.

3. The coupling device as claimed in claim 1, wherein the second dielectric material is air, the dielectric bar having, beyond this chamfer, an extension which supports the microstrip line and the semiconductor component, this coupling device being monolithic and supported entirely by the dielectric bar.

4. The coupling device as claimed in claim 1, wherein the dielectric bar is formed by alumina.

5. The coupling device as claimed in claim 1, wherein the dielectric bar is made from a semi-insulating material of the III-V group such as GaAS.

6. The coupling device as claimed in claim 1, wherein the semiconductor component is a bare Schottky type diode insert mounted on the microstrip line by means of its external beam leads.

7. A mixer between an ultra high frequency input signal and a local oscillator signal, injected into a metal wave guide, including a coupling device between the metal wave guide and a mixing diode for processing the ultra high frequency input signal, wherein a dielectric wave guide, of "isolated image" type, comprises a dielectric bar having a permittivity $\epsilon_1$ forming, with a surface of another dielectric material of permittivity $\epsilon_2$, an interface at the level of which is propagated a part of the energy of the signal channeled by the dielectric bar, said dielectric bar being introduced longitudinally into the metal wave guide and having a metal guide-dielectric guide transition zone formed by a chamfer, of length 10 $\lambda_g$, where $\lambda_g$=guided wave length, cut in the dielectric bar, the energy of the signal being coupled to the mixing diode by means of a microstrip matching line which forms a transition zone between the dielectric guide and the mixing diode, at the level of the interface between the dielectric bar and the dielectric material, wherein the microstrip matching line includes a plurality of wide metallizations forming capacities and a plurality of narrow metallizations forming self inductances, the assembly of the metallizations and of the diode being supported on a common substrate whose rear face is metallized so as to form the capacities and the ground plane, the intermediate frequency output of the mixer being collected from a coaxial connector soldered to the microstrip matching line, the mixing diode being further biased continuously through the connector.

8. The mixer as claimed in claim 7, wherein the substrate of the metallizations and of the diode is a quartz wafer in contact with the dielectric guide.

9. The mixer as claimed in claim 7, wherein the substrate of the metallizations and of the diode is the dielectric bar which forms the dielectric guide, this mixer being integrated and monolithic, the dielectric bar being a bar made from a semi insulating material of the group III-V such as GaAS and the diode being formed in the same material.

* * * * *